US006472687B1

(12) United States Patent
Wu et al.

(10) Patent No.: US 6,472,687 B1
(45) Date of Patent: Oct. 29, 2002

(54) LIGHT EMITTING DIODE WITH HIGH LUMINANCE AND METHOD THEREFOR

(76) Inventors: Yu-Shan Wu, 1001-1 University Road, Hsinchu (TW); Jian-Shihn Tsang, 1001-1 University Road, Hsinchu (TW); Shih-Hsiung Chan, 1001-1 University Road, Hsinchu (TW); Jan-Dar Guo, 1001-1 University Road, Hsinchu (TW)

( * ) Notice: Subject to any disclaimer, the term of this patent is extended or adjusted under 35 U.S.C. 154(b) by 0 days.

(21) Appl. No.: 09/391,370

(22) Filed: Sep. 8, 1999

(30) Foreign Application Priority Data

Sep. 9, 1998 (TW) .......................................... 87114962

(51) Int. Cl.[7] ......................... H01L 27/15; H01L 33/00
(52) U.S. Cl. ........................... 257/79; 257/99; 257/103
(58) Field of Search ............................ 257/79, 99, 103

(56) References Cited

U.S. PATENT DOCUMENTS

| 5,008,718 A | 4/1991 | Fletcher et al. | |
| 5,048,038 A | 9/1991 | Sugawara et al. | |
| 5,732,098 A | * 3/1998 | Nisitani et al. | 372/45 |
| 5,814,838 A | * 9/1998 | Ohtsuka et al. | 257/94 |
| 6,163,037 A | * 12/2000 | Matsumoto et al. | 257/101 |

FOREIGN PATENT DOCUMENTS

| JP | 406029570 A | * 2/1994 |
| JP | 07094778 | * 4/1995 |
| JP | 408335717 A | * 12/1996 |
| JP | 07185805 | * 2/1997 |
| JP | 410270752 A | * 10/1998 |
| JP | 2000058908 | * 2/2000 |

* cited by examiner

*Primary Examiner*—Eddie Lee
*Assistant Examiner*—Joseph Nguyen
(74) *Attorney, Agent, or Firm*—Finnegan, Henderson, Farabow, Garrett, & Dunner, L.L.P.

(57) ABSTRACT

The present invention pertains to a light emitting diode with high luminance and method therefor, and specially to a light emitting diode having a selectively highly-doped low resistive layer of InGaAlP. The selectively highly-doped low resistive layer may be grown by the current epitaxy technique. Therefore, the light emitting diode of the present application may be mass produced, thus having industrial applicability.

15 Claims, 3 Drawing Sheets

US 6,472,687 B1

LIGHT EMITTING DIODE WITH HIGH LUMINANCE AND METHOD THEREFOR

BACKGROUND OF THE INVENTION

1. Field of the Invention

The present invention pertains to a light emitting diode with high luminance and method therefor, and specially to a light emitting diode having a selectively highly-doped low resistant layer of InGaAlP.

2. Description of the Related Art

In a semiconductor made of group III or V composite, for an InGaAlP whose energy gap less than that of nitride, when the ratio of aluminum to gallium in the active region of the light emitting element is changed, the light wavelength varies from 680 nm to 550 nm. Further, since the lattice constant of InGaAlP can match the GaAs substrate perfectly, InGaAlP is suitable for the light emitting element used for visible light region.

As shown in FIG. 1, the Structure of a conventional InGaAlP light emitting diode is formed by growing a multi-layered epitaxy layer on a n type GaAs light-absorbing substrate 10. First, a n-InGaAlP confining layer 11 is grown on the GaAs substrate 10, and then a p-InGaAlP confining layer 13 is grown on an active layer 12 such that a double hetrostructure is formed. The light wavelength of the light emitting diode is determined by the ratio of aluminum to gallium in the active layer 12. An increase in the content of aluminum in the active layer may shorten the light wavelength of the light emitting diode. Meanwhile, the content of aluminum in the confining layers 11, 13 outside the active layer 12 must be greater than that of aluminum in the active layer 12 such that the carriers may be not only effectively injected into the active layer 12 but also prevent the light emitted from the active layer 12 from being absorbed by the confining layers 11 and 13. Besides, the light emitting surface of the diode is coated with a front surface metal electrode 14 and coated with a back surface metal electrode 15 on the surface of the GaAs substrate 10 on which the expiate layer is not formed.

Generally speaking, with the exception of the combination efficiency of the electron and the electric hole, the major factor for determining the light emitting efficiency of a light emitting diode is whether the current on the front surface electrode 14 can be effectively distributed to the boundary of grains such that the light can be uniformly produced from the p-n junction. If the p-type confining layer 13 is too resistant to effectively distribute the current, the current will flow from the front surface electrode 14 to the back surface electrode 15, causing current jamming such that the current can not be spread effectively and that most of the generated light can not emit due to the blocking of the opaque front surface electrode 14 or the light emitting efficiency thereof is reduced because the generated light is reflected by the metal electrode 14 and absorbed by the substrate. The conventional InGaAlP light emitting diode has the above drawbacks. This is because the impurity concentration of the p-type InGaAlP confining layer 13 is generally below $1 \times 10^{18}$ cm$^{-3}$ and the hole mobility thereof is merely 10~20 cm$^2 \cdot$V/sec, which forms the resistivity 0.5Ω-cm. The resistivity is so high that the lateral current can not be spread over the whole grain. To solve this problem, as shown in FIG. 2, a conventional technique, such as U.S. Pat. No. 5,008,718 develops a different structure. The structure as illustrated in FIG. 2 is formed by growing a semiconductor window layer 16 differing from the InGaAlP layer on the p-type InGaAlP confining layer 13. The window layer is characterized by its low resistivity, perfect conductivity, and energy gap greater than that of the active layer 12. Thus, the semiconductor window layer 16 does not absorb the light emitted from the p-n junction. The materials suitable for the semiconductor window layer 16 include GaAlAs, GaAsP, and GaP, etc. The optimum thickness for the window layer 16 ranges from five to tens of micrometers. However, the lattice constants of GaAsP and GaP do not match with those of the GaAs substrate and the InGaAlP layer 13, causing a large amount of dislocation on the growing interface and disadvantageously affecting the opto-electrionic characteristics of the light emitting diode. As shown in FIG. 3, another structure of the conventional technique, such as U.S. Pat. No. 5,048,035 is characterized by additionally forming a current blocking layer 17 and bragg reflector layer 18 with a current spreading layer or window layer 19 made out of GaAlAs. The diode structure of '035 patent is so configured that the current injected from the front surface electrode 14 is influenced by the current blocking layer 17 to be effectively distributed to the current spreading layer 19.

SUMMARY OF THE INVENTION

To avoid the above-mentioned problems encountered in the prior art, the present invention provides a novel high luminance InGaAlP light emitting diode having the following advantages:

(1) A highly doped low resistant layer is utilized as a mechanism for distributing the current.
(2) A current blocking layer is not needed.
(3) Doping sources alternatively used for growing the current blocking layer are not needed.

The light emitting diode of the present application comprises a first metal electrode, a substrate, a first confining layer, a n active layer, a second confining layer, a selectively highly doped low resistant layer, a multi-layered low light-absorbing current spreading layer and a second metal electrode and is characterized in that it is accomplished by the processing of two times epitaxially growing, one time masking and etching. The first epitaxially growing is that sequentially growing a first confining layer, an active layer, a second confining layer and a selectively highly-doped low resistive layer, and that a needed portion of selectively highly-doped low resistive layer remains after the selectively highly-doped low resistive layer is processed by masking and etching. The second epitaxially growing is that the chip of the InGaAlP light emitting diode according to he present application is grown a multi-layered low light-absorbing current spreading layer by an organic-metal vapor phase epitaxy (OMVPE) in the epitaxy system and coated with a first metal electrode and second metal electrode, thereby accomplishing the fabrication of the light emitting diode with high luminance of the present application.

According to a preferred embodiment of the present application, a p type highly-doped low resistive layer 20 is grown on a p type InGaAlP confining layer 13, and then is masked and etched to expose a portion of the p-InGaAlP confining layer 13. Because, the impurity concentration of the InGaAlP confining layer is less than $1 \times 10^{18}$ cm$^{-3}$, the exposed portion as mentioned above is the p-InGaAlP confining layer 13 having higher resistivity, thus rendering the current lowing towards the p type highly-doped low resistive layer 20 which remains by selectively etching, thereby achieving the current spreading.

Another object of the present application is to provide a method for manufacturing a light emitting diode of high luminance having a highly-doped low resistive layer by growing a p-type highly-doped low resistive layer 20 on an InGaAlP double hetrostructure, wherein the material of the layer 20 may be GaAs, GaAlAs, GaAsP, and GaP or any semiconductor material whose impurity concentration is greater than $1 \times 10^{18}$ cm$^{-3}$, and by the processing of the masking and etching to expose a p-type InGaALP confining layer 13 having greater resistivity so that the current flows towards the p-type highly-doped low resistive layer 20 to achieve the current spreading, thereby enhancing the light emitting efficiency of the light emitting diode.

BRIEF DESCRIPTION OF THE DRAWINGS

The invention will become more fully understood from the detailed description given hereinbelow and the accompanying drawings, which are given by way of illustration only, and thus are not imitative of the present invention, wherein.

DETAILED DESCRIPTION OF THE INVENTION

Figure 1:
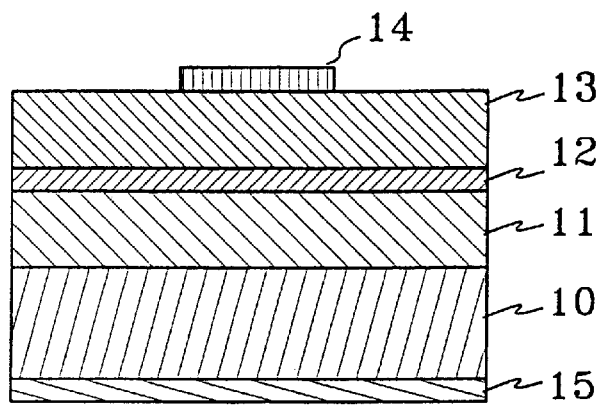
FIG. 1 is a sectional view of the structure of a conventional InGaAlP light emitting diode.
Figure 2:
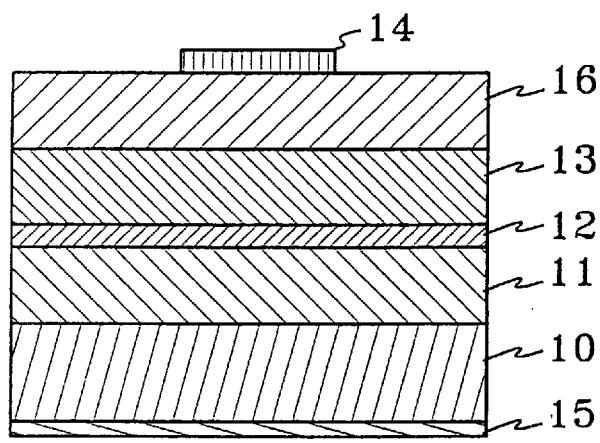
FIG. 2 is a sectional view of the structure of a conventional InGaAlP light emitting diode having a window layer.
Figure 3:
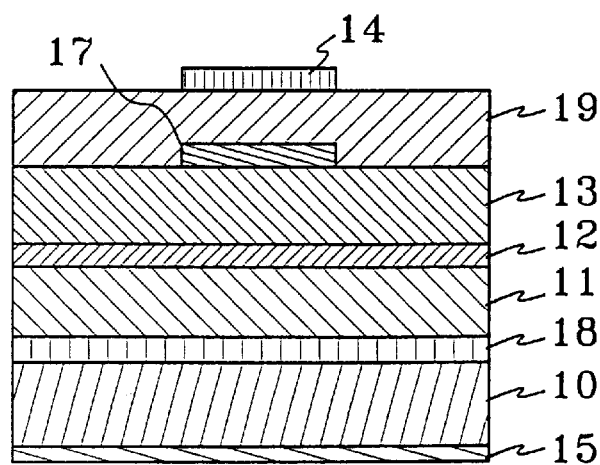
FIG. 3 is a sectional view of the structure of a conventional InGaAlP light emitting diode having a window layer, current blocking layer and bragg reflector layer.
Figure 4A:
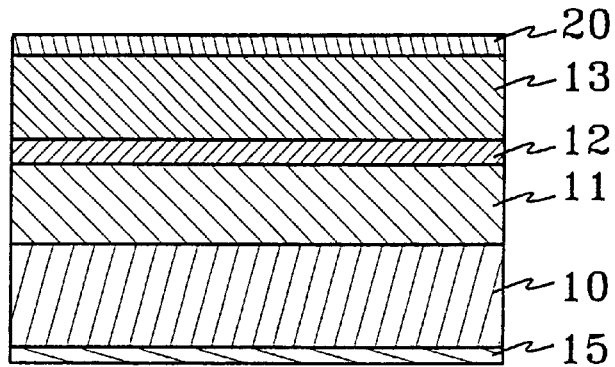
FIGS. 4(a)–(c) are sectional views of light emitting diode with high luminance according to a preferred embodiment of the present application.
Figure 4B:
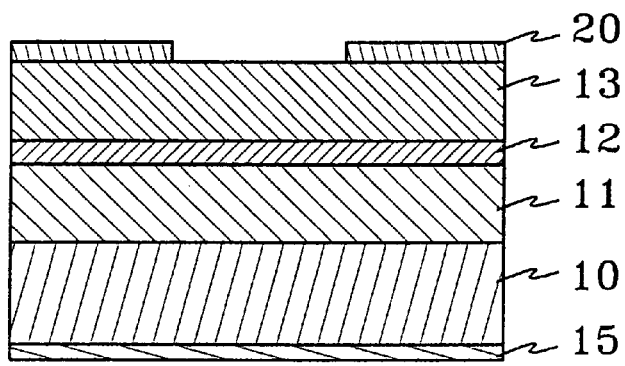
Figure 4C:
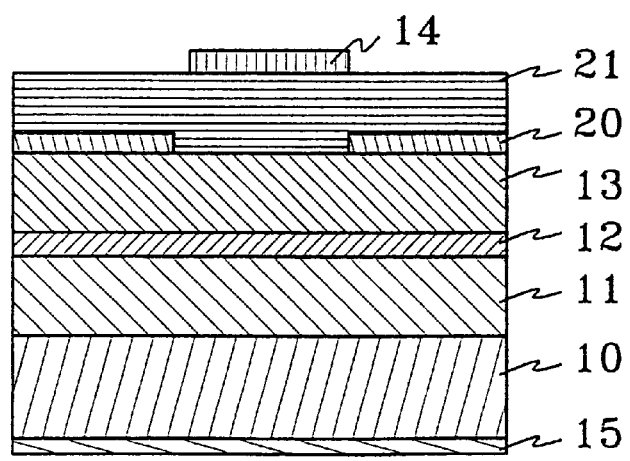

An object of the present application is to provide a novel high luminance of InGaAlP light emitting diode having a selectively highly doped, low-resistant layer. FIG. depicts a sectional view of an InGaAlP light emitting diode with high luminance according to a preferred embodiment of the present application. FIG. 4(a) shows the first epitaxially growing structure of an InGaAlP light emitting diode with high luminance according to a preferred embodiment of the present application. The diode is formed as follows. On a GaAs substrate 10 doped with a first type conductivity such as n-type dopant sequentially growing a confining layer 11 doped with the first type conductivity dopant, an InGaAlP active layer 12, and a InGaAlP confining layer 13 doped with a second type conductivity dopant to produce an InGaAlP double hetrostructure. A highly doped low resistive layer 20 doped with the second type conductivity dopant grows on the InGaAlP double heterostructure, wherein the materials of highly doped low resistant layer 20 may be selected from a group of GaAs, AlGaAs, GaAsP, and GaP or any semiconductor materials whose impurity concentration is greater that $1 \times 10^{18}$ cm$^{\times 3}$. As shown in FIG. 4(b), the highly doped low resistant layer 20 exposes a p-type InGaAlP confining layer 13 with higher resistivity after the processing of masking and etching. As shown in FIG. 4(c), after the processing of etching, a multi-layered low light-absorbing current spreading layer 21 grows by an organic-metal vapor phase epitaxy (OMVPE) or molecule beam epitaxy. The multi-layered low light-absorbing current spreading layer 21 is a multi-layered structure composed of GaP and GaAsP alternatively superposed or a multi-layered structure composed of GaP and GaAs alternatively superposed or a multi-layered structure composed of GaAs and AlGaAs alternatively superposed. The low light-absorbing current spreading layer 21 can only be formed by alternatively interposing the material whose energy gap greater than that of the active layer 12 and the material whose energy gap less than that of the active layer 12. The multi-layered structure is to reduce the resistivity and spread the current and to enable most of the light generated by the active layer 12 to pass through the layer 21 and then emit out of the diode. Preferably, each layer of the multi-layered low light-absorbing absorbing current spreading layer 21 has a thickness less than 5 micrometers. Finally, the upper surface on the light emitting surface of the light emitting diode is coated with a front surface electrode 14 and the lower surface of the n-type GaAs substrate 10 (i.e. the surface on which the epitaxy layer does not grow) is coated with a metal to form a back surface electrode 15.

FIG. 4(c) shows a sectional view of InGaALP light emitting diode having low light-absorbing current spreading layer 21 after the second epitaxially growing. In the light emitting diode with high luminance according to the present application, since the highly-doped low resistive layer 20 has a lower resistivity with respect to the p-type InGaAlP confining layer 13, when voltage is applied to the front surface electrode 14, the current will flow through the front surface electrode 14 towards the selectively highly-doped low resistive layer 20 having lower resistivity at the lateral sides thereby effectively spreading the current and then avoiding the current jamming. This can enhance the light emitting efficiency of the light emitting diode. Further, since, the energy gap of each of the confining layers 11, 13 beneath and above the active layer 12 is greater than that of the active layer 12, the carriers within the confining layers 11, 13 may be effectively injected into the active layer 12. and also the light generated by the active layer 12 will not be absorbed by the confining layers 11, 13.

Therefore, the structure of the light emitting diode of high luminance having a selectively highly-doped low resistive layer 20 according to the present application is simple, easily manufactured and has the effect of current spreading to enhance of the light emitting efficiency of the light emitting diode.

Figure 5A:
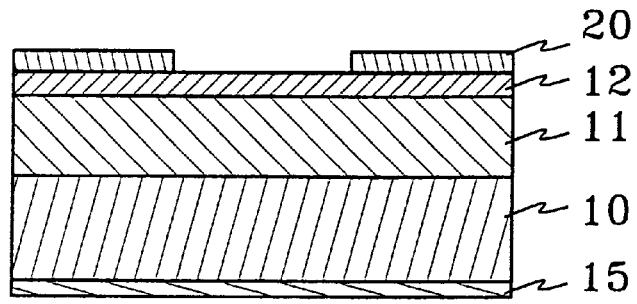
FIGS. 5(a)–(c) are sectional views of light emitting diode with high luminance according to another preferred embodiment of the present
Figure 5B:
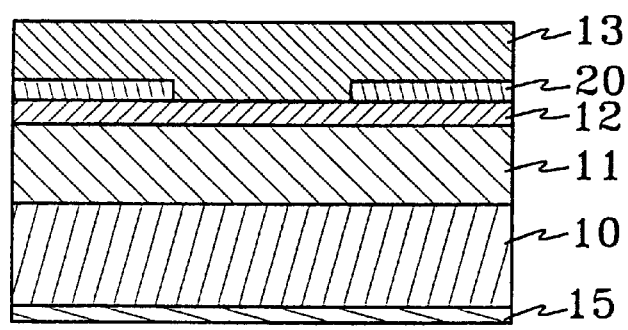
Figure 5C:
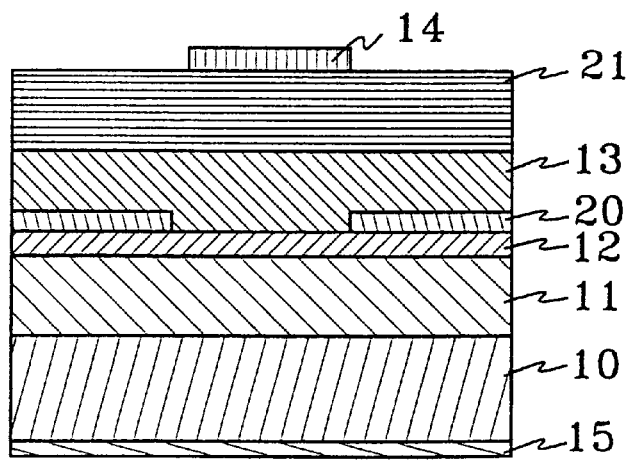

Similarly, FIG. 5 depicts a sectional view of a InGaALP light emitting diode according to another embodiment of the present application. FIG. 5(a) shows the first epitaxially growing structure of an InGaAlP light emitting diode with high luminance according to the present application. The diode is formed as follows. On a n-GaAs substrate 10 sequentially growing a n-InGaAlP confining layer 11, an InGaAlP active layer 12, and a p-type highly-doped low resistive layer 20. After the processing of the masking and etching, the highly-doped low resistive layer 20 exposes a portion of the InGaAlP active layer 12. As shown in FIG. 5(b), a p-InGaAlP confining 13 is grown on the highly-doped low resistive layer 20 and the exposed portion of the lnGaAlP active layer 12. In FIG. 5(c), after growing the confining layer 13, a multi-layered low light-absorbing current spreading layer 21 is grown by an organic-metal vapor phase epitaxy (OMVPE) or molecule beam epitaxy. Since the highly-doped low resistive layer 20 has a lower resistivity with respect to the p-type InGaAlP confining layer 13, when voltage is applied to the front surface electrode 14, the current will flow through the front surface electrode 14 towards the selectively highly-doped low resistive layer 20 having lower resistivity at the lateral sides, thereby effectively spreading the current and then avoiding the current jamming. This can enhance the light emitting efficiency of the light emitting diode. Further, since, the energy gap of each of the confining layers 11, 13 beneath and above the active layer 12 is greater than that of the active layer 12, the carriers within the confining layers 11, 13 may be effectively injected into the active layer 12. and also the light generated by the active layer 12 will not be absorbed by the confining layers 11, 13. Therefore, the structure of the light emitting diode of high luminance having a selectively highly-doped low resistive layer 20 according to the present application is simple, easily manufactured and has the effect of current spreading to enhance the light emitting efficiency of the light emitting diode.

In particular, any applications for specific functions employing a specific data stream in the field of wireless communication or computer network may be implemented according to the above descriptions and the illustration thereof.

Although the invention has been disclosed in terms of a preferred embodiment, the disclosure is not intended to limit the invention. The invention still can be modified, varied by persons skilled in the art without departing from the scope and spirit of the appended claims of the invention.

What is claimed is:

1. A light emitting diode, comprising:
   a substrate doped with a first conductivity type dopant;
   a first confining layer, formed on the substrate and doped with the first conductivity type dopant;
   an active layer, formed on the first confining layer;
   a second confining layer, formed on that active layer and doped with a second conductive type dopant;
   a selective highly-doped low resistive layer, formed on a portion of the second confining layer and doped with the second conductivity type dopant;
   a low light-absorbing current spreading layer, formed on the selective highly-doped low resistive layer and a portion of the second confining layer and doped with the second conductive type dopant, wherein the low light-absorbing current spreading layer is a multi-layered structure composed of non-light-absorbing materials and light-absorbing materials alternatively superposed;
   a metal electrode, formed on the bottom of the substrate; and
   a second metal electrode, formed on the low light-absorbing current spreading layer, thereby when voltage is applied to the second metal electrode, the current flows from the second electrode toward the selective highly-doped low resistive layer on the lateral sides to effectively spread out so as not to produce current jamming.

2. The light emitting diode as claimed in claim 1, wherein the first confining layer, active layer and second confining layer are all made out of InGaAlP.

3. The light emitting diode as claimed in claim 1, wherein the substrate is made out of GaAs.

4. The light emitting diode as claimed in claim 1, wherein each layer in the multi-layered structure of low light-absorbing current spreading layer is less than 5 micrometers.

5. The light emitting diode as claimed in claim 1, wherein the first conductivity type is p type, and the second conductivity type is n type.

6. The light emitting diode as claimed in claim 1, wherein the first conductivity type is n type, and the second conductivity type is p type.

7. The light emitting diode claimed in claim 1, wherein the material of the highly-doped low resistive layer is selected from a group of GaAs, AlGaAs, GaAsP, and GaP or from a group of semiconductor materials, the impurity concentration of each of which is greater than $1 \times 10^{18}$ cm$^{-3}$.

8. A light emitting diode, comprising:
   a substrate doped with a first conductivity type dopant;
   a first confining layer, formed on the substrate and doped with the first conductivity type dopant;
   an active layer, formed on the first confining layer;
   selective highly-doped low resistant layer, formed on a portion of the active layer and doped with the second conductivity type dopant;
   a second confining layer, formed on the selective highly-doped low resistive layer and a portion of the active layer and doped with a second conductive type dopant;
   a low light-absorbing current spreading layer, formed on the second confining layer and doped with the second conductive type dopant;
   a metal electrode, formed on the bottom of the substrate;
   a second metal electrode, formed on the low light-absorbing current spreading layer, thereby when voltage is applied to the second metal electrode, the current flows from the second electrode toward the lateral sides to effectively spread out so as not to produce current jamming.

9. The light emitting diode as claimed in claim 8, wherein the first confining layer, active layer and second confining layer are all made out of InGaAlP.

10. The light emitting diode as claimed in claim 8, wherein the substrate is made out of GaAs.

11. The light emitting diode as claimed in claim 8, wherein the low light-absorbing current spreading layer is a multi-layered structure composed of non-light-absorbing materials and light-absorbing materials alternatively superposed.

12. The light emitting diode as claimed in claim 11, wherein each layer in the multi-layered structure of the low light-absorbing current spreading layer is less than 5 micrometers.

13. The light emitting diode as claimed in claim 8, wherein the first conductivity type is p type, and the second conductivity type is n type.

14. The light emitting diode as claimed in claim 8, wherein the first conductivity type is n type, and the second conductivity type is p type.

15. The light emitting diode claimed in claim 8, wherein the material of the highly-doped low resistive layer is selected from a group of GaAs, AlGaAs, GaAsP, and GaP or from a group of semiconductor materials, the impurity concentration of each of which is greater than $1 \times 10^{18}$ cm$^{-3}$.

* * * * *